United States Patent [19]

Bouley et al.

[11] 4,441,187

[45] Apr. 3, 1984

[54] A SEMICONDUCTOR LASER LIGHT SOURCE

[76] Inventors: Jean-Claude Bouley, 35, Avenue du Docteur Durand, 94110 Arcueil; Josette Charil, 61, Avenue Victor Hugo, 92140 Clamart; Guy Chaminant, 64bis, rue de Paris, 91570 Bievres, all of France

[21] Appl. No.: 283,631

[22] Filed: Jul. 15, 1981

[30] Foreign Application Priority Data

Jul. 31, 1980 [FR] France ................ 80 16947

[51] Int. Cl.³ .............................................. H01S 3/19
[52] U.S. Cl. ........................................ 372/46; 357/15; 357/17
[58] Field of Search ........................... 372/44, 45, 46; 357/15 R, 15 A, 17, 61

[56] References Cited

U.S. PATENT DOCUMENTS 4,206,468 6/1980 Carballes ........................... 372/46
4,238,764 12/1980 Carballes et al. .................. 357/65
4,352,187 9/1982 Amann ............................... 372/45

Primary Examiner—James W. Davie
Attorney, Agent, or Firm—Oblon, Fisher, Spivak, McClelland & Maier

[57] ABSTRACT

A light source with a semiconductor junction having a substrate on which are successively deposited a first and second semiconductor layer having opposite doping and means for injecting charge carriers from a power supply, whein the means includes a highly doped contact layer partly covered by an alloyed metal layer forming an ohmic contact and a metal layer covering the alloyed layer, together with the remainder of the second semiconductor layer, with the metal layer being connected to the power supply and wherein the semiconductor constituting the second layer is chosen from among those which form a Schottky diode in contact with a metal like that of the metal layer. The diode is reverse polarized under the normal operating conditions of the source with the zone in which charge injection takes place consequently being limited to a single ohmic contact zone, excluding the zones in which there is a Schottky diode.

7 Claims, 2 Drawing Figures

A SEMICONDUCTOR LASER LIGHT SOURCE

BACKGROUND OF THE INVENTION

The present invention relates to a light source with a semiconductor junction, particularly a laser source and to a process for producing such a source. It is used in optics and more specifically in optical telecommunications.

Although the invention is applicable to any light source with a semiconductor junction, the following description refers in an explanatory manner to a particular category of such sources, namely coherent or laser sources. The reason is that such devices are of particular interest in the field of optical telecommunications. However, other sources (called light emitting diodes with a semiconductor "emitting by the edge") are not excluded from the scope of the invention. In an even more specific manner, the following description is particularly directed at lasers of the type having a double heterostructure and a strip junction, because such lasers constitute preferred sources in optical telecommunications using the near infrared. However, once again, other types of semiconductor lasers are not excluded from the invention. Finally, although the examples described will essentially relate to the InP semiconductor, the invention is in no way limited to this material. In fact, it covers all known materials fulfilling the conditions which will be defined hereinafter and particularly InP-based ternary or quaternary compounds or GaP-InP ternary compounds or GaAs-P-InGaP alloys.

It is known that a laser with a double heterostructure and a junction comprises a substrate on which are successively deposited a lower confinement layer, an active layer, an upper confinement layer and finally a contact layer.

In order to bring about a continuous operation at ambient temperature, the injection of charge carriers is confined to an active rectangular surface with a width of a few microns (10 to 20 $\mu$m-strip) limited at the two ends by two cleavages.

The preferred field of such lasers consists of long distance optical fibre telecommunications for which the most interesting emission wavelengths are 1.3 and 1.55 $\mu$m.

A laser using as the material GaInAsP/InP and operating continuously at ambient temperature is described in the article published by J. J. HSIEH in the Journal "Applied Physics Letters", Vol. 28, p. 709, 1976. This is a strip laser obtained by proton bombardment and emitting at 1.1 $\mu$m. A laser emitting at 1.3 $\mu$m is described in the article by K. OE et al published in the Journal "JapanJ.App.Phys", Vol. 16, 1977, No. 7, p. 1273. In this case, the strip is produced by means of ohmic contact deposited in the disengaged part of a dielectric (SiO$_2$) covering the plate. An article entitled "GaInAsP/InP planar stripe lasers prepared by using sputtered SiO$_2$ film as a Zn-diffusion mask" published by K. OE et al in the Journal "J.Appl. Phys", 51, (1), January 1980, p. 43 describes the influence of the technology used for producing the strip (SiO$_2$ deposition and zinc diffusion) on the properties of the lasers obtained.

The article by R. J. Nelson et al entitled "High-output power in GaAsP ($\lambda$=1.3 $\mu$m) strip buried heterostructure lasers" published in the Journal "Appl. Phys.-Lett" 36, (5), Mar. 1st 1980, p. 358 describes a strip (buried) laser using the compound InP.

The most frequently used strip definition method is that of placing a contact through a window defined in a dielectric layer covering the contact layer. This deposit may optionally serve as a diffusion mask, as described in the article of K. OE referred to hereinbefore. This article also shows the prejudicial influence of the constraints exerted by the dielectric on the zinc diffusion mechanisms beneath the strip and their effects on the mode structure of the laser. In addition, such constraints increase the speed at which the junctions deteriorate.

The methods of insulating the strip by proton bombardment have not as yet been performed in a satisfactory manner for lasers emitting at 1.3 $\mu$m, doubtless due to an inadequate insulation of the bombarded regions.

The technology of lasers having a buried structure is too complicated (particularly due to epitaxy renewal) to obtain an adequate reproducibility and reliability.

BRIEF SUMMARY OF THE INVENTION

The problem of the invention is to obviate these disadvantages by proposing a semiconductor junction light source, with a very simple structure and not involving the use of proton bombardment or the deposition of dielectric layers.

According to the invention, the injection of the charge carriers is confined by producing zones having a reverse-polarized Schottky diode, said barrier opposing the current injection and limiting the same to the zones having an ordinary ohmic contact. It is pointed out that a Schottky diode (or Schottky barrier diode) is constituted by a semiconductor metal contact having rectifying properties. The semiconductors suitable for forming such diodes are known, reference can be made for example to the article by W. E. SPICER et al entitled "New and unified model for Schottky barrier and III-V insulator interface states formation" published in the Journal J. Vac. Sci. Technol. 16, (5), Setp/Oct 1979.

More specifically, the present invention relates to a light source with a semiconductor junction comprising a substrate on which are successively deposited a first and second semiconductor layer having opposite doping and means for injecting charge carriers from a power supply, wherein said means comprises a highly doped contact layer partly covered by an alloyed metal layer forming an ohmic contact and a metal layer covering the alloyed layer, together with the remainder of the second semiconductor layer, said metal layer being connected to the power supply and wherein the semiconductor constituting the second layer is chosen from among those which form a Schottky diode in contact with a metal like that of the metal layer, said diode being reverse polarized under the normal operating conditions of the source, the zone in which charge injection takes place consequently being limited to a single ohmic contact zone, excluding the zones in which there is a Schottky diode.

As stated hereinbefore, such a light source cna have different forms and properties, but in preferred manner it constitutes a coherent light source or laser.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
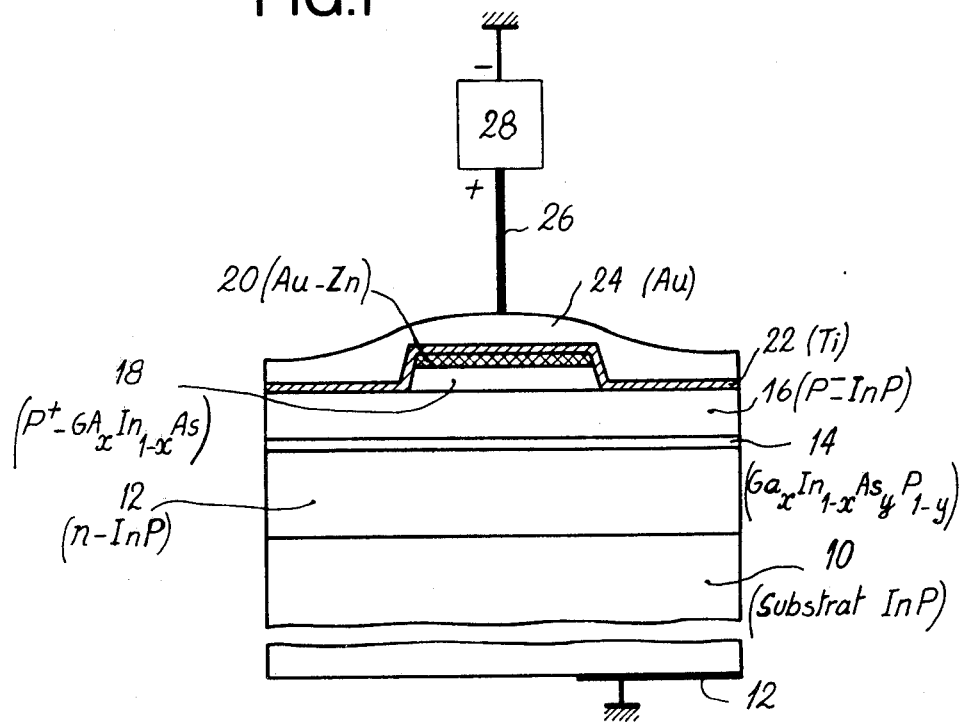
FIG. 1 a section through a strip-type heterostructure laser according to the invention.

The laser shown in FIG. 1 successively comprises:
- a substrate 10, e.g. of InP, whose lower part is covered with a metal contact 12 connected to earth;
- a lower confinement layer 12, e.g. of InP doped with tin (n doping);
- an active layer 14, e.g. of composition $Ga_xIn_{1-x}As_yP_{1-y}$, in which x and y are numbers below 1, said layer not being doped, numbers x and y being chosen on the one hand so that the crystalline parameter of this layer is in agreement with that of the surrounding layers and on the other so that the wavelength of the radiation emitted is in the desired range (1.3 or 1.55 μm);
- an upper confinement layer 16, e.g. of InP, weakly p-doped by means of zinc (doping of approximately $10^{16}$ cm$^{-3}$);
- a contact layer 18, e.g. of composition $Ga_xIn_{1-x}As$ (x=0.53) highly p+doped by means of zinc, said layerbeing in the form of a mesa obtained by selective chemical etching and of width approximately 20 μm or less;
- an ohmic contact 20 of alloy metal, e.g. gold-zinc which covers the mesa;
- a metal layer 22, e.g. of titanium covered with a metal layer 24, e.g. of gold, said two layers covering the alloyed contact and the part of the upper confinement layer located on either side of the mesa;
- and finally an electrical connection 26 connected to a power supply 28.

Figure 2:
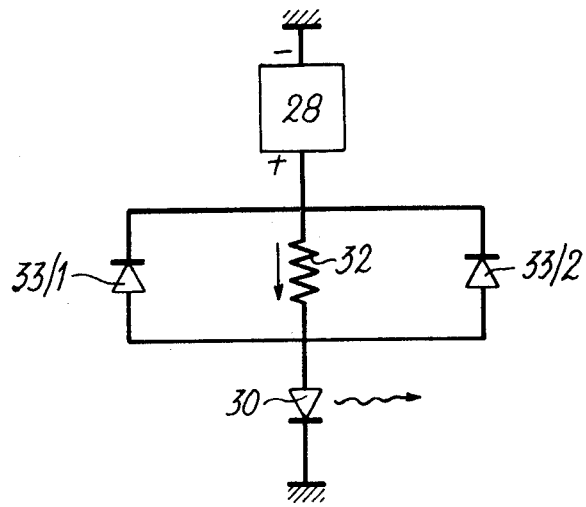
FIG. 2 the equivalent circuit diagram of the laser of FIG. 1.

According to the invention, metal layer 22 forms with the semiconductor layer 16 which it covers a Schottky diode which, under normal operating conditions, is reverse-polarized. The equivalent circuit diagram of the assembly is then that of FIG. 2 in which it is possible to see a diode 30 which is the emitting part of the device and which is supplied by power supply 28 across a resistor 32, representing the ohmic contact formed by the alloyed metal layer 20 and contact layer 18. The diode is surrounded by two Schottky diodes 33/1, 33/2 which are reverse-polarized and correspond to the contacts between metal layer 22 and semiconductor layer 16 on either side of the mesa. The reverse polarization of these two diodes is equal to the voltage drop brought about in resistor 32. This drop is approximately 0.5 V for an Au-Zn contact and for a threshold current of 0.25 A and a series resistance of approximately 2Ω. This drop is well below the breakdown voltage of the Schottky diode, which is a few volts. The two lateral Ti-Au contacts consequently create a very effective electrical insulation.

The article by M. C. AMANN entitled "New stripe geometry laser with simplified fabrication process" published in the Journal "Electronics Letters", July 5th 1979, Vol. 15, No. 14, p. 441 describes a strip laser applicable to GaAs-GaAlAs lasers. This laser has certain points in common with that described hereinbefore, because it also has a metal layer (Cr-Au) covering the complete structure. However, in actual fact, the structure according to the invention is fundamentally different, at least with regard to the confinement of the charge injection. Thus, the prior art structure is based on the resistance difference between the contacts of the Cr-Au layer either on GaAs or on GaAlAs, but in no case is it based on the formation of a Schottky contact. The application of the prior art structure in the case of double heterostructures InGaAsP/InP would not be successful because the contact resistance difference obtained in this case would be inadequate. The alloy of the contact would have the effect of creating a zinc-overdoped region both on the contact layer and on the confinement layer, thus causing contact resistances whose values are not sufficiently different.

With regards to the process of producing the laser in question, it should be noted that the main difficulty is in the definition of the mesa and forming the alloyed Au-Zn contact on top. The sequence of operations chosen for the invention, because it is the most advantageous, is as follows:
- definition of the mesa by chemical etching using a resin mask;
- deposition of the Au-Zn contact by the so-called lift off method consisting of removing the resin film under the metal and entraining the latter with the resin;
- annealing the contact to form the alloy.

The opposite order consisting of firstly forming the Au-Zn contact and then using it as a mask for chemically etching the contact layer would lead to a very poor geometrical definition of the strip, due to a very significant under-etching below the contact.

For illustrative purposes, the various operations of the production process can be as follows:
(1) Reducing the thickness of the plate which has undergone epitaxy on the substrate side using a process employed for As-Ga lasers, so as to obtain good quality cleavages.
(2) Formation of the contacts:
2.1 Substrate side (n):
Deposition by the vacuum evaporation of an approximately 1000 Å Au-Ge layer to an Ni underlayer of a few hundred Å, which aids the adhesion of the Au-Ge.
2.2 Layer side (p):
Local protection of the InGaAs contact layer by a resin strip of typical width 20 μm and chemical etching so as to disengage the InP confinement layer by a solution of $H_2SO_4+H_2O_2+H_2O$ in proportions 3:1:3 at ambient temperature. Although selective, this solution could etch InGaAs and if the effect was too violent would lead to under-etching without the resin strip. At 20° C. the etching speed is approximately 1μ/min and the width of the strips remains well defined. After obtained the mesa, superimposition by the so-called lift off method of the Au-Zn (5%) strip by vacuum evaporation with a thickness of approximately 2000 Å.
2.3 Annealing the ohmic contacts:
The Au-Ge-Ni and Au-Zn contacts are annealed at the same time at about 440° C. in a furnace under a hydrogenated argon atmosphere, cooling being started as soon as the temperature of 440° C. is reached. Under these conditions, a contact resistance of $3.10^{-5}$ Ωcm$^2$ is obtained on the n side and of $1.25 \cdot 10^{-4}$ on $In_{0.53}Ga_{0.47}As$.
2.4 Schottky contacts:
Deposition of a Ti-Au layer (200-3000 Å) titanium, like nickel, improving the adhesion of the gold to the InP layer.

Lasers produced in this way operate continuously at ambient temperature with lower threshold currents than those obtained by prior art methods. Continuously operating lasers with a 130 mA threshold current have been obtained for strips 20 μm wide, 180 μm long and with a 0.4 μm active region thickness. By reducing the thickness of the active layer to 0.2 μm, as well as the width of the strip to approximately 12 μm (optimum width of the GaAlAs) a threshold current of 50 mA can be reached, which is much better than in the prior art procedures (with the exception of buried channel lasers, but in connection with which the aforementioned production difficulties are encountered).

In addition, the lasers according to the invention are of the transverse monomode type. The typical width of the mid-height radiation characteristic is 7° in the plane parallel to the junction and 40° in the perpendicular plane.

What is claimed is:

1. A light source with a semiconductor junction comprising a substrate on which are successively deposited a first and second semiconductor layer having opposite doping, a highly doped contact layer partly covered by an alloyed metal layer forming an ohmic contact and a metal layer covering the alloyed layer, together with the remainder of said second semiconductor layer, said metal layer being connected to a power supply, wherein the semiconductor constituting the second layer is chosen from among those which form a Schottky diode in contact with said metal layer, said Schottky diode being reverse polarized under the normal operating conditions of the light source, a charge injection taking place in a zone limited to said single ohmic contact excluding the zones in which there is a Schottky diode.

2. A laser of the type having a double heterostructure and a strip junction and comprising a substrate on which are successively deposited a lower confinement layer, an active layer, an upper confinement layer, a contact layer in the form of a mesa surmounted by an alloyed metal layer forming an ohmic contact, wherein a metal layer covers the ohmic contact and the upper confinement layer, the semiconductor constituting the upper confinement layer being chosen from among those which, in contact with this metal, form a Schottky diode, the ohmic contact thus being surrounded by two Schottky diodes, which are reverse-polarized under the normal operating conditions of the laser and which oppose the injection of charges into the lateral zones of the upper confinement layer.

3. A source according to claim 2, wherein the upper confinement layer is of InP.

4. A source according to claim 3, wherein the contact layer has the following composition: $Ga_xIn_{1-x}As(x=0.53)$.

5. A source according to claims 3 or 4, wherein the metal layer is a titanium film.

6. A source according to claim 5, wherein the titanium film is coated by a gold deposit.

7. A source according to claim 2, wherein the alloyed metal layer in an alloy Au-Zn deposit.

* * * * *